US006632478B2

(12) United States Patent
Gaillard et al.

(10) Patent No.: US 6,632,478 B2
(45) Date of Patent: *Oct. 14, 2003

(54) PROCESS FOR FORMING A LOW DIELECTRIC CONSTANT CARBON-CONTAINING FILM

(75) Inventors: Frederic Gaillard, Voiron (FR); Li-Qun Xia, Santa Clara, CA (US); Jen Shu, Saratoga, CA (US); Ellie Yieh, San Jose, CA (US); Tian-Hoe Lim, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 119 days.

This patent is subject to a terminal disclaimer.

(21) Appl. No.: 09/791,989

(22) Filed: Feb. 22, 2001

(65) Prior Publication Data

US 2002/0164429 A1 Nov. 7, 2002

(51) Int. Cl.[7] .......................... C23C 16/40; H01L 21/31
(52) U.S. Cl. .............................. 427/255.37; 427/249.1; 427/376.2; 427/535; 438/787; 438/788; 438/789; 438/790
(58) Field of Search ....................... 427/255.37, 255.31, 427/376.2, 372.2, 533, 535, 249.1

(56) References Cited

U.S. PATENT DOCUMENTS

| | | | |
|---|---|---|---|
| 5,043,300 A | 8/1991 | Nulman | |
| 5,314,724 A | 5/1994 | Tsukune et al. | |
| 5,338,362 A | 8/1994 | Imahashi | |
| 5,447,570 A | 9/1995 | Schmitz et al. | |
| 5,532,191 A | 7/1996 | Nakano et al. | |
| 5,605,867 A | 2/1997 | Sato et al. | |
| 5,610,105 A | 3/1997 | Vines et al. | |
| 5,741,740 A | 4/1998 | Jang et al. | |
| 5,804,259 A | 9/1998 | Robles | |
| 5,872,065 A | 2/1999 | Sivaramakrishnan | |
| 5,900,290 A | 5/1999 | Yang et al. | |
| 5,958,510 A | 9/1999 | Sivaramakrishnam et al. | |
| 6,001,728 A | 12/1999 | Bhan et al. | |
| 6,057,224 A | 5/2000 | Bothra et al. | |
| 6,077,764 A | 6/2000 | Sugiarto et al. | |
| 6,090,167 A | 7/2000 | Bhan et al. | |
| 6,103,601 A | 8/2000 | Lee et al. | |
| 6,410,462 B1 * | 6/2002 | Yang et al. | 438/788 |
| 6,420,277 B1 * | 7/2002 | Catabay et al. | 438/763 |
| 6,426,308 B1 * | 7/2002 | Park et al. | 438/785 |
| 6,348,725 B2 | 8/2002 | Chen | |
| 6,429,122 B2 * | 8/2002 | Chooi et al. | 438/637 |
| 6,448,186 B1 * | 9/2002 | Olson et al. | 438/758 |
| 6,465,372 B1 * | 10/2002 | Xia et al. | 438/787 |

FOREIGN PATENT DOCUMENTS

| | | |
|---|---|---|
| DE | 199 04 311 A1 | 8/1999 |
| EP | 0 421 203 A1 | 4/1991 |
| EP | 0 721 019 A2 | 7/1996 |
| EP | 0 774 533 A1 | 5/1997 |
| EP | 0 884 401 A1 | 12/1998 |
| EP | 1 050 600 A1 | 11/2000 |
| EP | 1 050 601 A1 | 11/2000 |
| EP | 1 077 477 A1 | 2/2001 |
| EP | 1 077 479 A1 | 2/2001 |
| EP | 1 077 480 A1 | 2/2001 |
| WO | WO 99/19910 | 4/1999 |

OTHER PUBLICATIONS

K.V. Guinn et al., "Chemical Vapor Deposition of $SiO_2$ From Ozone–Organosilane Mixtures Near Atmospheric Pressure," *Material Research Society Symp. Proc.*, vol. 282, pp. 575–580 (1993).
S. Nag et al., "Carbon Doped Silicon Oxide Films for Sub–0.25 μm Technology Interconnect Isolation," *Novellus Systems, Inc., San Jose, CA*, pp. 74–78 No Date Available.
A. Nara et al., "Low Dielectric Constant Isulator by Downstream Plasma CVD at Room Temperature Using $Si(CH_3)_4$/$O_2$," *Extended Abstracts of the 1996 International Conference on Solid State Devices and Materials, Yokohama*, pp. 815–817 (1996).
A. Nara et al., "Low Dielectric Constant Insulator Formed by Downstream Plasma CVD at Room Temperature Using TMS/$O_2$," *Jpn. J. Appl. Phys.*, vol. 36, Part 1, No. 3B, pp. 1477–1480 (Mar. 1997).
G.M. Renlund et al., "Silicon Oxycarbide Glases: Part I. Preparation and Chemistry," *J. Material Research*, vol. 6, No. 12, pp. 2716–2722 (Dec. 1991).
Y. Song et al., "Optical and Structural Properties of Low–Temperature PECVD ETMS $SiO_x$ Thin Films," *Thin Solid State Films 334*, pp. 92–97 (1998).
Y. Uchida et al., "Chemical–Vapor Deposition of OH–free and Low–k Organic–Silica Films," *Jpn. J. Appl. Phys.*, vol. 37, Part 1, No. 12A, pp. 6369–6373 (Dec. 1998).
H. Wong et al., "Chemical of Silicon Oxide Annealed in Ammonia," *Applied Surface Science*, pp. 49–54 (1993).
H. Sugimara et al., "Silicon Oxide Films of Controlled Refractive Indices Prepared by RF Plasma CVD," *Int. Conf. Process Mater. Prop.*, pp. 1117–1120 (1993) *abstract*.

* cited by examiner

Primary Examiner—Bret Chen
(74) Attorney, Agent, or Firm—Townsend and Townsend and Crew

(57) ABSTRACT

An embodiment of the present invention provides methods for forming a carbon-containing layer having a low dielectric constant and good gap-fill capabilities. A method includes depositing a carbon-containing layer on a substrate and transforming the carbon-containing layer to remove at least some of the carbon. The transforming step may include annealing the carbon-containing layer in a furnace containing a hydrogen atmosphere, for example. The carbon-containing layer may be a carbon-doped silicon oxide material, where the transforming step changes the carbon-doped silicon oxide. Additionally, the method may include subjecting the annealed layer to a hydrogen and/or low oxygen plasma treatment to further remove carbon from the layer. Additionally, a step of adding a capping layer to the annealed, plasma treated material is provided. Products made by the above methods are also included, such as a product including a low k carbon-containing layer where the low k carbon-containing layer has been transformed to remove some of the carbon from the layer. An additional product includes a transformed carbon-containing layer further subjected to a hydrogen plasma treatment to remove more carbon from the layer. Further, a capping layer deposited over the transformed and hydrogen plasma treated layer is provided.

46 Claims, 3 Drawing Sheets

PROCESS FOR FORMING A LOW DIELECTRIC CONSTANT CARBON-CONTAINING FILM

FIELD OF THE INVENTION

The present invention relates generally to the formation of dielectric layers during fabrication of integrated circuits on semiconductor wafers and specifically to methods for providing dielectric films having low dielectric constants.

BACKGROUND OF THE INVENTION

The manufacture of integrated circuits involves procedures for forming thin films and layers of various materials on wafers of base semiconductor material and selectively removing areas of such films to provide structures and circuitry. Doped silicon is a typical base wafer material used.

Many procedures for forming thin films on semiconductor substrates involve the chemical reaction of gases to form the films. Such a deposition process is referred to as chemical vapor deposition ("CVD"). Conventional thermal CVD processes supply reactive gases to the substrate surface where heat-induced chemical reactions take place to produce a desired film. Plasma enhanced CVD techniques ("PECVD"), on the other hand, promote excitation and/or dissociation of the reactant gases by the application of radio frequency ("RF") or microwave energy. The high reactivity of the released species reduces the energy required for a chemical reaction to take place, and thus lowers the required temperature for such PECVD processes.

Semiconductor device geometries have dramatically decreased in size since such devices were first introduced several decades ago. Today's fabrication plants are routinely producing devices having 0.25 $\mu$m and even 0.18 $\mu$m feature devices, and tomorrow's plants will be producing devices having even smaller geometries. In order to further reduce the size of the devices on integrated circuits, it has become necessary to use conductive materials having low resistivity and insulators having low dielectric constants. Low dielectric constant films are desirable for premetal dielectric ("PMD") layers and intermetal dielectric ("IMD") layers to reduce the RC delay time of the interconnect metalization, to prevent cross-talk between the different levels of metalization and to reduce device power consumption.

Undoped silicon oxide films deposited using conventional CVD techniques may have a dielectric constant ("k") as low as about 4.0 or 4.2. One approach to obtain a lower dielectric constant is to incorporate other elements in with the silicon oxide film, e.g., fluorine to form doped silicon with fluorine. Fluorine-doped silicone oxide films (also referred to as fluorine silicate glass or "FSG" films) may have a dielectric constant as low as about 3.4 or 3.6. Despite this improvement in the dielectric constant, films having even lower dielectric constants are highly desirable for the manufacture of integrated circuits using geometries of 0.18 $\mu$m and smaller. Numerous films have been developed in attempts to meet these needs including various carbon-based dielectric layers, such as parylene and amorphous fluorinated carbon. While the above types of dielectric films are useful for some applications, manufacturers are always seeking new and improved methods of decreasing dielectric constants still farther.

SUMMARY OF THE INVENTION

An embodiment of the present invention provides methods for forming a carbon-containing layer having a low dielectric constant and good gap-fill capabilities. The method includes depositing a carbon-containing layer on a substrate and transforming the carbon-containing layer to remove at least some of the carbon.

The transforming step may include annealing the carbon-containing layer in a furnace containing a hydrogen atmosphere, for example.

The carbon-containing layer may be a carbon-doped silicon oxide material, where the transforming step changes the carbon-doped silicon oxide.

Additionally, the method may include subjecting the annealed layer to a hydrogen and/or low oxygen plasma treatment to further remove carbon from the layer.

Additionally, a step of adding a capping layer to the annealed, plasma treated material is provided.

Products made by the above methods are also included, such as a product including a low k carbon-containing layer where the low k carbon-containing layer has been transformed to remove some of the carbon from the layer. An additional product includes a transformed carbon-containing layer further subjected to a hydrogen plasma treatment to remove more carbon from the layer. Further, a capping layer deposited over the transformed and hydrogen plasma treated layer is provided.

According to the present invention, a stacked layer structure is provided, which includes a transformed and/or plasma treated low k layer deposited on a substrate and a capping layer deposited on top of the low k material.

DETAILED DESCRIPTION OF THE INVENTION

Figure 1:
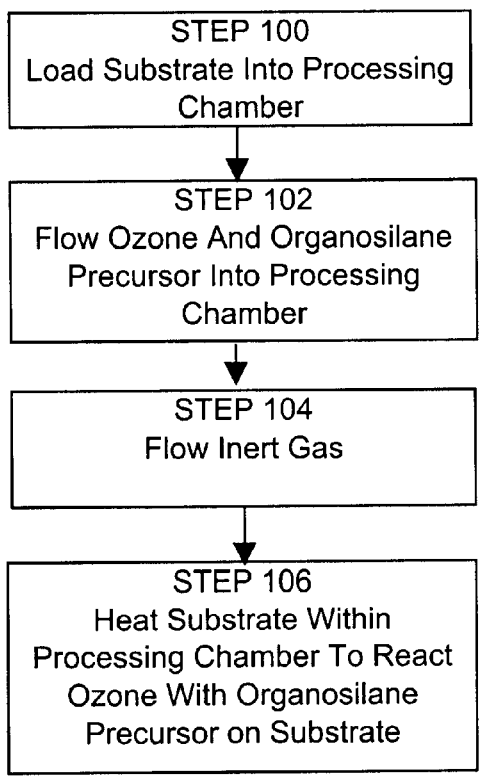
FIG. 1 is a flow chart illustrating the steps performed in depositing a carbon-containing layer on a substrate using a CVD process according to the methods of the present invention.

Before the present embodiments are described, it is to be understood that this invention is not limited to particular materials, substrates, etc. described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value and intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "and", and "the" include plural referents unless the context clearly dictates otherwise. Thus, for example, reference to "a substrate" includes a plurality of such substrates and reference to "the metal" includes reference to one or more metals and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

DEFINITIONS

"Dielectric" as used herein refers to a material in which an electric field can be maintained with zero or near zero power dissipation, i.e., the electrical conductivity is zero or near zero.

"Integrated Circuit' as used herein refers to an electronic circuit having multiple individual circuit elements, such as transistors, diodes, resistors, capacitors, inductors, and other active or passive semiconductor devices, formed on a single chip of semiconductor material and mounted on a single piece of substrate.

"Low k" and "Low k Material" as used herein refers to dielectric material having a dielectric constant (i.e., "k") less than about 3.0.

I. Low k Material

As described above, the present invention is directed towards methods of forming a porous carbon-containing film, i.e., layer, for use in semiconductor fabrication and a porous carbon-containing layer produced by the subject methods with a low dielectric constant and good gap fill capabilities. In exemplary embodiments, a carbon-containing film, e.g., carbon-doped silicon oxide film, is formed on a substrate and then transformed with an annealing gas. The carbon-containing film is transformed such that at least some carbon is removed resulting in greater film porosity and the dielectric constant, i.e., k value, is reduced.

In certain embodiments, the annealing gas is comprised of at least hydrogen. The annealed layer may then be subjected to further treatment steps, for example a hydrogen plasma treatment to further remove carbon from the layer and thus decrease the dielectric constant of the layer. Another layer e.g., a capping layer may be deposited on the annealed layer or the annealed and plasma treated layer to stabilize it. In further describing the invention, the subject methods, exemplary embodiments of the methods and a description of the layers produced by the methods are described.

A. Film Deposition

The invention provides a method for depositing a film, e.g., a carbon-containing layer, on a substrate. The steps of the process are illustrated FIG. 1. Deposition of a carbon-containing layer can be accomplished by either thermal, chemical vapor deposition (CVD) or plasma enhanced chemical vapor deposition (PECVD) processes, where such processes are well known to those of skill in the art.

In exemplary embodiments, the layer is a carbon-containing layer, e.g., a carbon-doped silicon oxide film. For example, such a carbon-doped silicon oxide film may be formed over a substrate, i.e., a semiconductor wafer, by flowing ozone and an organosilane precursor in the process chamber. In certain embodiments, one or more organosilane precursors may be selected from the following group of compounds:

| | |
|---|---|
| methylsilane, | $CH_3$—$SiH_3$ |
| dimethylsilane, | $(CH_3)_2$—$SiH_2$ |
| trimethylsilane, | $(CH_3)_3$—$SiH$ |
| tetramethylsilane, | $(CH_3)_4$—$Si$ |
| dimethylsilanediol, | $(CH3)_2$—$Si$—$(OH)_2$ |
| ethylsilane, | $CH_3$—$CH_2$—$SiH_3$ |
| phenylsilane, | $C_6$—$H_5$—$SiH_3$ |
| diphenylsilane, | $(C_6H_5)_2$—$SiH_2$ |
| diphenylsilanediol, | $(C_6H_5)_2$—$Si$—$(OH)_3$ |
| methylphenylsilane, | $C_6H_5$—$SiH_2$—$CH_3$ |
| disilanomethane, | $SiH_3$—$CH_2$—$SiH_3$ |
| bis(methylsilano)-methane, | $CH_3$—$SiH_2$—$CH_2$—$SiH_2$—$CH_3$ |
| 1,2-disilanoethane, | $SiH_3$—$CH_2$—$CH_2$—$SiH_3$ |
| 1,2-bis(methylsilano)-ethane, | $CH_3$—$SiH_2$—$CH_2$—$CH_2$—$SiH_2$—$CH_3$ |
| 2,2-disilanopropane, | $SiH_3$—$C(CH_3)_2$—$SiH_3$ |
| 1,3,5-trisilano-2,4,6-trimethylene, | $+SiH_2CH_2+$(cyclic) |
| dimethyldimethoxy-silane, | $(CH_3)_2$—$Si$—$(OCH_3)_2$ |
| diethyldiethoxysilane, | $(CH_3CH_2)_2$—$Si$—$(OCH_2$—$CH_3)_2$ |
| dimethyldiethoxysilane, | $(CH_3)_2$—$Si$—$(OCH_2CH_3)_2$ |
| diethyldimethoxysilane, | $(CH_3CH_2)_2$—$Si$—$(OCH_3)_2$ |
| 1,3-dimethyldisiloxane, | $CH_3$—$SiH_2$—$O$—$SiH_2$—$CH_3$ |
| 1,1,3,3-tetramethyldi-siloxane, | $(CH_3)_2$—$SiH$—$O$—$SiH$—$(CH_3)_2$ |
| hexamethyidisiloxane, | $(CH_3)_3$—$Si$—$O$—$Si$—$(CH_3)_3$ |
| 1,3-bis(silanomethylene)-disiloxane, | $(SiH_3$—$CH_2$—$SiH_2$—$)_2$—$O$ |
| bis(1-methyldisiloxanyl)-methane, | $(CH_3$—$SiH_2$—$O$—$SiH_2$—$)_2$—$CH_2$ |
| 2,2-bis(1-methyl-disiloxanyl)propane, | $(CH_3$—$SiH_2$—$O$—$SiH_2$$)$—$C(CH_3)_2$ |
| 2,4,6,8-tetramethylcyclo-tetrasiloxane, | $+SiHCH_3$—$O$—$)_4$(cyclic), |
| octamethylcyclotetra-siloxane, | $+Si(CH_3)_2$—$O$—$)_4$(cyclic)' |
| 2,4,6,8,10-pentamethyl-cyclopentasiloxane, | $+SiHCH_3$—$O$—$)_5$(cyclic) |
| 1,3,5,7-tetrasilano-2,6-dioxy-4,8-dimethylene, | $+SiH_2$—$CH_2$—$SiH_2$—$O$—$)_2$(cyclic) |
| 2,4,6-trisilanetetra-hydropyran, | $SiH_2$—$CH_2$—$SiH_2$—$CH_2$—$SiH_2$—$O$—(cyclic) |

-continued

| | |
|---|---|
| 2,5-disilanetetrahydro-furan, and fluorinated derivatives thereof. | —SiH$_2$—CH$_2$—CH$_2$—SiH$_2$—O—(cyclic), |

The preferred organosilane compounds include:

| | |
|---|---|
| dimethylsilane, | (CH$_3$)$_2$—SiH$_2$ |
| trimethylsilane, | (CH$_3$)$_3$—SiH |
| tetramethylsilane, | (CH$_3$)$_4$—Si |
| dimethylsilanediol, | (CH$_3$)$_2$—Si—(OH)$_2$ |
| diphenylsilane, | (C$_6$H$_5$)$_2$—SiH$_2$ |
| diphenylsilane, | (C$_6$H$_5$)$_2$—SiH$_2$ |
| diphenylsilanediol, | (C$_6$H$_5$)$_2$—Si—(OH)$_3$ |
| methylphenylsilane, | C$_6$H$_5$—SiH$_2$—CH$_3$ |
| bis(methylsilano)methane, | CH$_3$—SiH$_2$—CH$_2$—SiH$_2$—CH$_3$ |
| 1,2-bis(methylsilano)ethane, | CH$_3$—SiH$_2$—CH$_2$—CH$_2$—SiH$_2$—CH$_3$ |
| 1,3,5-trisilano-2,4,6-trimethylene, | —(SiH$_2$CH$_2$)—(cyclic) |
| 1,1,3,3-tetramethyldisiloxane, | (CH$_3$)$_2$—SiH—O—SiH—(CH$_3$)$_2$ |
| dimethyldimethoxysilane, | (CH$_3$)$_2$—Si—(OCH$_3$)$_2$ |
| diethyldiethoxysilane, | (CH$_3$CH$_2$)$_2$—Si—(OCH$_2$—CH$_3$)$_2$ |
| dimethyldiethoxysilane, | (CH$_3$)$_2$—Si—(OCH$_2$CH$_3$)$_2$ |

However, other such precursors as known to those of skill in the art may be used in the present invention as well. Many embodiments of the present invention also introduce an inert gas flow, in addition to the organosilane and ozone precursor gas flows, into the chamber during the deposition process. The inert gas flow helps stabilize the deposition process and improves the thickness uniformity of the deposited film. For example, helium or other inert gases such as argon or nitrogen may be used. The inert gas should not include elements that incorporate into the film in any significant manner.

As indicated above, the carbon-containing layer may be deposited by flowing an organosilane precursor gas and ozone into a processing chamber and heating the substrate within the chamber to a temperature less than about 350° C. In an exemplary embodiment, the deposition temperature, i.e., the temperature of the substrate during deposition is kept below 250° C., and usually less than 150° C. In many embodiments, a pedestal heater directly heats the substrate. The pressure inside the chamber may range from about 1 to 760 torr, usually between 50 to 250 torr.

Figure 2:
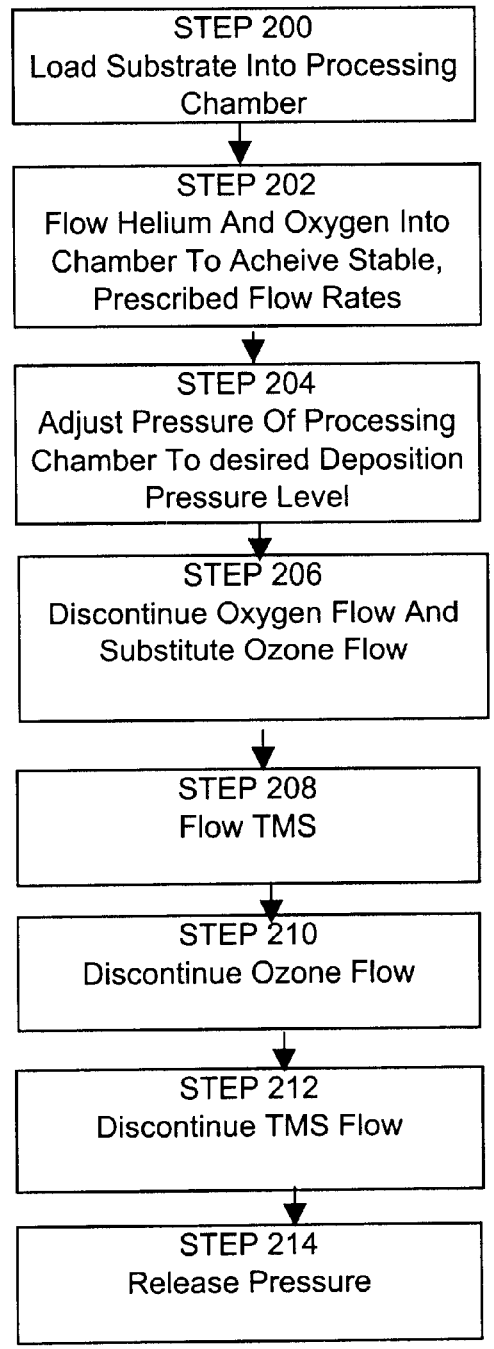
FIG. 2 is a flow chart illustrating the steps performed in depositing a carbon-containing layer on a substrate using a thermal process according to the methods of the present invention.

In one embodiment, shown in FIG. 2, a carbon-doped silicon oxide film is deposited using a thermal, as opposed to a plasma CVD process. TMS, ozone and helium gases are flowed over a substrate, e.g. a semiconductor wafer, in a processing chamber for about 1 to 10 minutes. The deposition process is initiated after a wafer has been loaded into a deposition chamber and helium (6000 sccm) and oxygen (4000 sccm) gases are flowed while keeping the processing chamber throttle valve fully open for several seconds in order to stabilize the gas flows. Oxygen is added to the helium flow at the same rate at which ozone is subsequently added. Flowing oxygen in this manner results in a substantially constant oxygen/helium ratio throughout the deposition process to improve film uniformity. Ozone is not introduced at this stage because of the high reactivity of ozone.

Once the gas flow has been stabilized, the processing chamber throttle valve is partially closed and the pressure within the chamber is brought to a desired deposition pressure level, usually about 10 to 500 torr, more usually about 100 torr. Once the pressure is reached and maintained for a couple of seconds, an ozone flow (4000 sccm) is substituted for the oxygen flow and a flow of TMS is initiated (500 sccm) to deposit a carbon-doped silicon oxide film. The ozone flow is turned off when the film reaches a desired thickness. The ozone is turned-off prior to the TMS flow in order to allow the TMS to react with residual ozone in the gas phase. The TMS flow is then shut-off and the deposition pressure is released by opening the processing chamber throttle valve while maintaining the helium flow. Finally, all the gases are shut-off.

The above-described embodiment deposits a carbon-doped silicon oxide film with a dielectric constant of about 17, good gap-fill properties, and is suitable for use as either a PMD or IMD layer.

The gas flow rates recited and described above are designed for deposition processes run in a Centura Dxz chamber manufactured by Applied Materials of Santa Clara, Calif. A person of ordinary skill in the art will recognize that the rates at which various precursor gases in the process gas are in part chamber specific and will vary if chambers of other design and/or volume are employed.

B. Film Annealing

Once the carbon-doped silicon oxide film is deposited on a substrate, the film may be annealed, e.g., to impart desirable characteristics to the film. For example, annealing the film may decrease the dielectric constant, for example by removing carbon hydrides from the film to create a more porous film.

Figure 3:
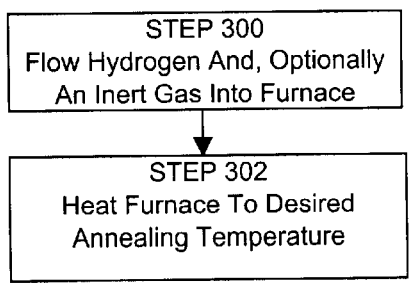
FIG. 3 is a flow chart illustrating the steps performed in annealing the carbon-containing layer according to the methods of the present invention.

Various processes may be used to anneal the film. In exemplary embodiments, a hydrogen anneal process, such as diagrammed in FIG. 3, may be employed. In such a hydrogen anneal process, the carbon-doped silicon oxide film is exposed to an environment usually comprising at least hydrogen gas at a pressure of about 100 to 760 torr. Embodiments of the subject invention may also introduce an inert gas flow, in addition to the hydrogen gas flow. The inert gas flow helps stabilize the annealing process by removing volatile species. Many embodiments introduce a flow of nitrogen as the inert gas, but other embodiments may introduce other inert gases such as oxygen, hydrogen, argon, helium and the like, or a mixture thereof. The hydrogen may come from H$_2$, NH$_3$, or from any other hydrogen-containing source that will decompose to provide a source of hydrogen with appropriate properties, e.g., TMS. The nitrogen, if used, may come from N$_2$ or from any other nitrogen-containing source that will decompose to provide a source of nitrogen with the appropriate properties. In certain embodiments, hydrogen and nitrogen may come from a single source, for example NH$_3$. In exemplary embodiments where both hydrogen and nitrogen are employed, the gas mixture usually has between about 1 to 10% H$_2$ and 90 to 99% N$_2$ by volume.

In embodiments where hydrogen is used as the annealing gas, the hydrogen gas may be flowed at about 500–3000 sccm in a vacuum conventional furnace, for example a horizontal or vertical furnace manufactured by MRL or other like furnace as would be known to one of skill in the art. As is commonly known to one of skill in the art, where greater than one gas is flowed, the gases may be flowed serially, concurrently, independently and the like. Similarly, the gases may be flowed at the same flow rate, different flow rates, alternating flow rates or varied flow rates. In those embodiments where a mixture of gas, e.g., hydrogen and an inert gas such as nitrogen are employed, the flow rates are about 1000 to 10,000 sccm for nitrogen and about 500 to 3000 for hydrogen.

The temperature at which the annealing process occurs ranges from about 250° C. to 550° C., usually from about 300° C. to 500° C. and more usually from about 350° C. to 450° C. The annealing process usually takes approximately 30 minutes in the furnace with a pressure of about 100 to 760 torr, however longer or shorter times may be useful as well. Of course, process parameters may vary according to furnace geometry, design and the like.

The annealing process of the present invention results in removal of at least some of the carbon, for example in the form of hydrides, from the film. The hydrogen acts as a reducing agent removing carbon atoms from the film. It is believed that the hydrogen reacts with carbon hydride molecules in the film to create substantially volatile $CH_4$, where such $CH_4$ may then be pumped out of the furnace during and after the annealing process.

The removal of the carbon from the film creates pores in the film, i.e., porous films, e.g. carbon-doped silicon oxide films annealed according to the present invention are more porous when compared to films, e.g., carbon-doped silicon oxide films, not subjected to the present annealing process. For example, films not subjected to the annealing process of the present invention generally have a density in the range of about 1.20 to 1.40 $g/cm^3$, and more usually about 1.22 to 1.27 $g/cm^3$. Comparatively, films subjected to the annealing processes of the present invention generally have a density of less than or equal to about 1.10 to 1.30 $g/cm^3$ and more usually about 1.21 $g/cm^3$. The annealed film's porosity provides for a decrease in the dielectric constant. In certain embodiments, the dielectric constant of the annealed carbon-doped silicon oxide film is in the range of about 2.5 to 3.0, usually between about 2.6 and 2.7.

The porosity of the present invention is provided by very small pores, e.g., micropores or submicropores, as opposed to larger pores found in some porous oxide layers. Typically, these pores are substantially evenly distributed throughout the film and have diameters less than about 100 Å, and usually in the range of about 10 to 30 Å.

C. Plasma Treatment

Figure 4:
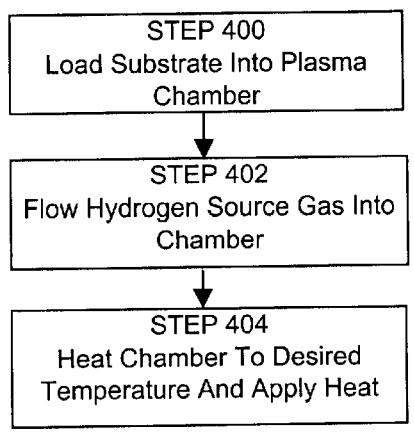
FIG. 4 is a flow chart illustrating the steps of plasma treating the annealed carbon-containing layer according to the methods of the present invention.

As stated above, in order to further increase the porosity of the film after the annealing process and thus further decrease the dielectric constant, e.g., remove more carbon from the film, the annealed film may be subjected to subsequent processing step(s), as illustrated by FIG. 4. In another embodiment of the present invention, the annealed film may be exposed to a plasma treatment. In one version of this embodiment, the plasma consists of a hydrogen source to produce a hydrogen ion bombardment treatment. In exemplary embodiments, the hydrogen is provided by $H_2$ gas, $NH_3$, TMS, or other hydrogen-containing source that will decompose to provide a source of hydrogen with appropriate properties. A plasma is formed by applying a RF power component to the gas. The hydrogen ions from the plasma act as a reducing agent removing carbon atoms from the film. The hydrogen reacts with carbon, e.g., carbon hydrides in the film to create substantially volatile $CH_4$, where such $CH_4$ is then removed from the chamber during and at the end of the process.

This post-annealing hydrogen plasma treatment may be performed by maintaining a carbon-containing material, for example a carbon-doped silicon oxide film deposited and annealed according to the present invention, in a plasma processing chamber at a temperature within the range of about 300° C. to 500° C., more usually between about 400° C. to 500° C. Pressure is maintained between about 1 to 100 torr, more usually between about 50 to 100 torr.

In an exemplary embodiment, the plasma consists of a hydrogen containing source gas such as $H_2$. The gas is introduced into the chamber at a rate of between about 250 to 2000 sccm, usually between about 500 to 1000 sccm. The flow of the gas may vary according to the geometry and design of the chamber.

A power source with a frequency of between about 5 to 20 MHz, usually between about 10 to 15 MHz with a power between about 0 Watts to 2000 Watts and usually between about 200 to 300 Watts is applied. In typical applications, a post-annealing hydrogen plasma treatment step of between about 10 to 300 seconds, usually between about 20 to 60 seconds, is used.

In yet another version of this embodiment, the plasma step bombards the carbon-doped silicon oxide film with ions from a nitrogen-containing source and a hydrogen-containing source. In such a step, the hydrogen containing source and nitrogen containing source may be from a single source gas such as ammonia ($NH_3$).

Thus, the hydrogen plasma treatment according to the present invention provides increased porosity to the underlying annealed carbon-containing film. In exemplary embodiments, the hydrogen further removes carbon from the annealed film to increase the film's porosity and decrease the film's dielectric constant. As described above, the carbon is removed as carbon hydrides which form substantially volatile $CH_4$, which is then removed from the chamber. The dielectric constant of film subjected to the above described hydrogen plasma treatment is less than about 2.2.

The gas flow rates recited and described above are designed for plasma treatment processes run in a Centura Dxz chamber manufactured by Applied Materials. A person of ordinary skill in the art will recognize that the rates at which various gases in the process gas are introduced are in part chamber specific and will vary if chambers of other design and/or volume are employed.

D. Capping Layer

A capping layer may be formed on an annealed film or an annealed and plasma treated film, where preferably the hydrogen plasma process and the capping process are performed contemporaneously. This capping layer improves film stability and decreases film shrinkage which may accompany the plasma treatment. The capping layer may also provide a substantially hydrophobic surface on top of the film layer that prevents moisture present in the ambient from being absorbed into the film.

The capping layer is comprised of helium and a capping gas. In one version of this embodiment, the separate layer, i.e., capping layer, is a BLOk™ layer manufactured by Applied Materials, Santa Clara, Calif., formed in a plasma enhanced CVD deposition chamber, wherein the capping gas is comprised of TMS. However other capping layers known to those of skill in the art may be used as well, for example a SiC layer may be used. Still further, a capping layer may be a SiN layer, wherein the capping gas may be comprised of ammonia ($NH_3$) or other known nitrogen-containing precursor gases, for example. The capping layer prevents shrinkage by providing a relatively hard, rigid film over the underlying layer(s) which helps stabilize the underlying structure.

Figure 5:
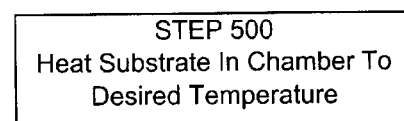
FIG. 5 is a flow chart illustrating the steps performed in capping the film of the present invention.
Figure 5:
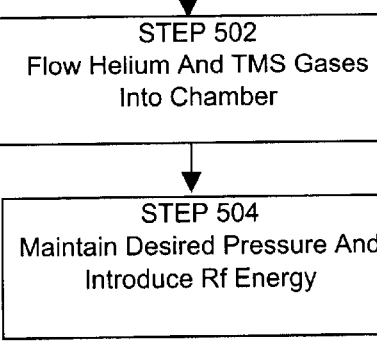

The capping layer may be deposited over the underlying film in a separate processing chamber than that which was used for the hydrogen plasma treatment, but preferably is done as an in-situ process. As shown in FIG. 5, the annealed and hydrogen plasma treated carbon-doped silicon oxide film is heated to a temperature within the range of about 200 to 500° C., but usually from about 300 to 400° C. and then maintained at this temperature throughout the capping plasma treatment.

The capping layer is comprised of helium with or without NH₃ and at least one capping gas selected from the group consisting of TMS and NH₃. A gaseous mixture is introduced into the deposition chamber. In an exemplary embodiment wherein the capping layer is a BLOk™ layer, the gaseous mixture is TMS with or without NH₃ and helium with or without NH₃, i.e., Blok™. The total flow of the gaseous reactants will vary according to the design and geometry of the plasma chamber. Typically, the TMS is introduced at a flow rate of between about 5 and 500 sccm, and usually between about 10 to 200 sccm. Helium is introduced at a flow rate of about 10 to 500 sccm, and usually between about 100 to 300 sccm. The gases are usually introduced at the same time. Chamber pressure is maintained at a pressure of between 0.5 and 20 torr, and usually between about 3 to 10 torr. The plasma is formed using a frequency of about 5 to 20 MHz, and usually about 10 to 15 MHz at between about 0 to 2000 watts, usually about 200 to 800 watts, and more usually about 200 to 500 watts.

Thus, the capping layer, deposited over a carbon-containing film, i.e., a carbon-doped silicon oxide layer which has been subjected to the annealing and hydrogen plasma treatment steps of the present invention, provides stability to the underlying film, e.g., prevents film shrinkage which may accompany the hydrogen plasma treatment step and may also provide a substantially hydrophobic barrier over the film.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process step or steps, to the object, spirit and scope of the present invention. All such modifications are intended to be within the scope of the claims appended hereto.

II. Exemplary Structure

Figure 6:
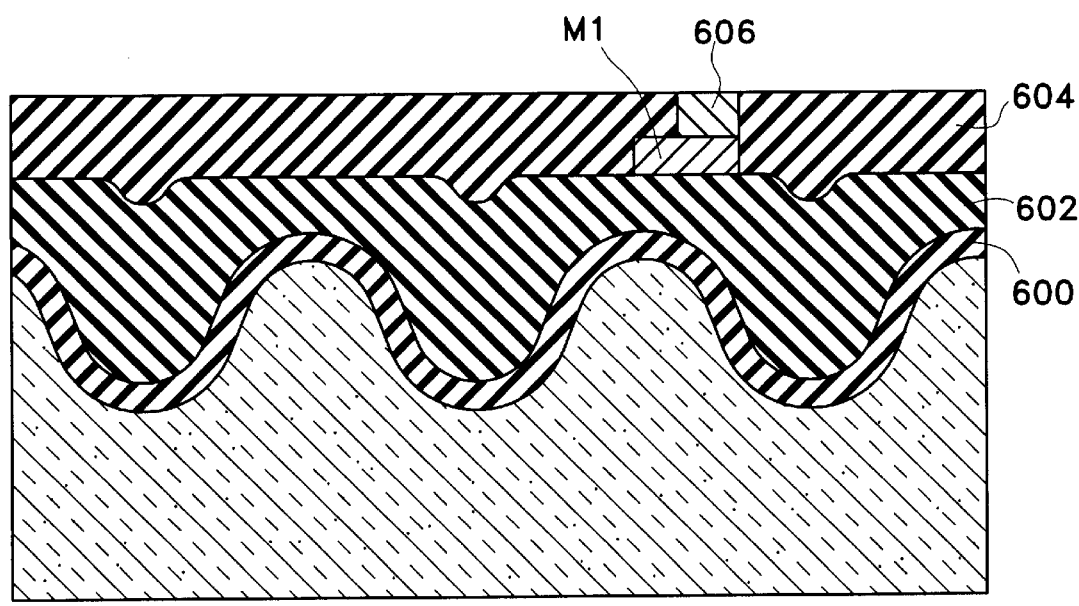
FIG. 6 is a simplified cross-sectional view of a semiconductor device manufactured according to the methods of the present invention.

FIG. 6 illustrates a simplified cross-sectional view of a film produced according to the present invention over adjacent raised surfaces. The figure illustrates a carbon-doped silicon oxide film 600, which has been hydrogen annealed and plasma treated to remove some of the carbons. Capping layer 602 is shown overlaying the carbon film 600.

While the dielectric layer of the present invention may find various uses in an integrated circuit, physical properties of the film such as its low dielectric constant and good gap-fill properties make it most useful as an insulation layer between adjacent metal layers.

The dielectric layer of the present invention may also be used in damascene layers which are included in some integrated circuits. In damascene layers, a blanket layer such as layer 604 is deposited over a substrate, selectively etched through to the substrate and then filled with metal and etched back or polished to form metal contacts such as M1. After the metal layer is deposited, a second blanket layer deposition is performed and selectively etched. The etched area is then filled with metal and etched back or polished to form vias 606.

It should be understood that this simplified view is for illustrative purposes only and one of ordinary skill in the art could implement the present methods for fabrication for various integrated circuits such as microprocessors, application specific integrated circuits (ASICS), memory devices, and the like.

That which is claimed is:

1. A method of forming a low k dielectric film on a substrate, the method comprising:
    depositing a carbon-containing dielectric film over the substrate by flowing a process gas comprising ozone and a gas comprising an organosilane having at least one silicon-carbon bond into a processing chamber in which the substrate is disposed;
    thereafter, annealing the carbon-containing dielectric film by heating the substrate while exposing the substrate to a flow of a hydrogen source; and
    thereafter, exposing the annealed carbon-containing dielectric film to dissociated species formed from a plasma formed from a hydrogen source;
    wherein the carbon-containing dielectric film has a first dielectric constant after it is initially deposited, a second dielectric constant that is less than the first dielectric constant after it is annealed and a third dielectric constant that is less than the second dielectric constant after it is exposed to the dissociated hydrogen species.

2. The method of claim 1 wherein the said organosilane is selected from the group consisting of methysilanes, dimethylsilanes, trimethylsilanes, tetramethylsilanes and phenylmethylsilanes.

3. The method of claim 1 wherein said carbon containing layer is a carbon-doped silicon oxide layer.

4. The method of claim 1 wherein the carbon containing dielectric layer is deposited at a temperature less than about 350° C. and at a pressure between about 1 to 760 torr.

5. The method of claim 4 wherein the carbon containing dielectric layer is deposited at a temperature less than about 250° C. and at a pressure between about 10 to 500 torr.

6. The method of claim 4 wherein the carbon containing dielectric layer is deposited at a temperature less than about 150° C.

7. The method of claim 1 wherein during the annealing step the carbon containing dielectric film is exposed to a flow of a hydrogen gas at a flow rate between about 500 to 3000 sccm while being heated to a temperature of between about 250° C. to about 550° C. in an atmosphere having a pressure of between 100 to 760 torr.

8. The method of claim 7 wherein the annealing step is performed at a temperature of between about 350° C. to about 450° C.

9. The method of claim 1 further comprising flowing an inert gas along with the hydrogen source during the annealing step.

10. The method of claim 1 further comprising flowing an inert gas along with the process gas during the depositing step.

11. The method of claim 1 further comprising flowing a nitrogen source along with the hydrogen source during the annealing step.

12. The method of claim 11 wherein the hydrogen source comprises one of H₂, NH₃ and TMS, and wherein the nitrogen source comprises one of N₂ and NH₃.

13. The method of claim 11 wherein the annealing step flows a gaseous mixture comprising about 1 to 10% H₂ and 90 to 99% N₂ by volume.

14. The method of claim 1 wherein the plasma is formed from a nitrogen source along with the hydrogen source.

15. The method of claim 14 wherein the nitrogen and hydrogen sources are a single source.

16. The method of claim 15 wherein the single source is NH₃.

17. The method of claim 15 wherein the carbon containing dielectric film is exposed to the dissociated species for between about 10 to 300 seconds during the exposing step.

18. The method of claim 17 wherein the carbon containing dielectric film is exposed to the dissociated species for between about 20 to 60 seconds during the exposing step.

19. The method of claim 1 wherein a flow rate of the hydrogen source into the plasma is between about 250 to 2000 sccm.

20. The method of claim 19 wherein the flow rate of the hydrogen source into the plasma is between about 500 to 1000 sccm.

21. The method of claim 1 wherein the plasma is formed in a chamber maintained at a temperature between about 300° C. to about 500° C. and at a pressure of between about 1 to 100 torr during the exposing step.

22. The method of claim 21 wherein the chamber is maintained at a temperature between about 400° C. to about 500° C. and at a pressure between about 50 to 100 torr during the step.

23. The method of claim 1 wherein the dissociated species are formed in a plasma chamber by applying RF energy at a power up to about 2000 Watts.

24. The method of claim 23 wherein the dissociated species are formed in a plasma chamber by applying said RF energy at a power of between about 200 to 300 Watts.

25. The method of claim 1 further comprising capping the carbon-containing dielectric film after the exposing step wit a capping layer.

26. The method of claim 25 wherein the capping layer is deposited from a capping gas comprising TMS.

27. The method of claim 26 wherein the capping gas further comprises $NH_3$.

28. The method of claim 25 wherein the capping layer is deposited from a capping gas comprising $NH_3$.

29. The method of claim 25 wherein the capping layer has at least one Si N bond.

30. The method of claim 25 wherein the capping layer has at least one Si C bond.

31. The method of claim 1, further comprising capping the layer after completion of said annealing, said capping comprising the steps of:

flowing helium and a capping gas into a processing chamber containing the substrate and layer; and reacting the helium with the capping gas to form a capping layer on the carbon-containing layer on the substrate.

32. The method of claim 1 wherein the second dielectric constant is between about 2.5 and 3.0.

33. The method of claim 32 wherein the third dielectric constant is less than about 2.2.

34. The method of claim 33 wherein a difference between the first dielectric constant and the second dielectric constant is 14 or greater.

35. The method of claim 34 wherein the first dielectric constant is about 17.

36. The method of claim 1 wherein the annealing step takes place in a vacuum furnace.

37. A method of forming a low k dielectric film on a substrate, the method comprising:

depositing a carbon-doped silicon oxide film over the substrate in a thermal CVD process by flowing a process gas comprising ozone and a gas comprising an organosilane having at least one silicon-carbon bond into a processing chamber in which the substrate is disposed and heating the substrate to a temperature less than 250° C. while maintaining the substrate processing chamber at a pressure of between about 10 and 500 Torr;

thereafter, annealing the carbon-doped silicon oxide film by heating the substrate to a temperature between about 250 to 550° C. while exposing the substrate to a flow of a hydrogen source; and thereafter, exposing the annealed carbon-doped silicon oxide film to dissociated species formed from a plasma formed from a hydrogen source;

wherein the carbon-doped silicon oxide film has a first density and a first dielectric constant after it is initially deposited, a second density and a second dielectric constant after it is annealed that are less than the first density and first dielectric constant, respectively, and a third density and a third dielectric constant after it is exposed to the dissociated hydrogen species that are the second dielectric constant respectively.

38. The method of claim 37 wherein the second dielectric constant is between about 2.5 and 3.0.

39. The method of claim 38 wherein the second density is between about 1.10 and 1.30 g/cm$^3$.

40. The method of claim 38 wherein the third dielectric constant is less than about 2.2.

41. The method of claim 40 wherein a difference between the first dielectric constant and the second dielectric constant is 14 or greater.

42. The method of claim 41 wherein the first dielectric constant is about 17.

43. The method of claim 37 wherein the first density is between about 1.20 and 1.40 g/cm$^3$.

44. A method of forming a low k dielectric film on a substrate, the method comprising:

depositing a carbon-doped silicon oxide film over the substrate in a thermal CVD process by flowing a process gas comprising ozone and a gas comprising an organosilane having at least one silicon-carbon bond into a processing chamber in which the substrate is disposed and heating the substrate to a temperature less than 250° C. while maintaining the substrate processing chamber at a pressure of between about 10 and 500 Torr;

thereafter, annealing the carbon-doped silicon oxide film to reduce the film's dielectric constant and increase its porosity by heating the substrate to a temperature between about 250 to 550° C. while exposing the substrate to a flow of a hydrogen source;

thereafter, exposing the annealed carbon-doped silicon oxide film to dissociated species formed from a plasma formed from a hydrogen source to further reduce the film's dielectric constant and further increase the film's porosity;

wherein a carbon content of the carbon-doped silicon oxide film is decreased in the annealing further decreased in the exposing step.

45. The method of claim 44 wherein the hydrogen source used in the annealing step comprises $H_2$.

46. The method of claim 45 wherein the hydrogen source used in the exposing step comprises $H_2$.

* * * * *